(12) United States Patent
Bierhuizen et al.

(10) Patent No.: US 8,097,894 B2
(45) Date of Patent: Jan. 17, 2012

(54) LED WITH MOLDED REFLECTIVE SIDEWALL COATING

(75) Inventors: Serge J. Bierhuizen, Santa Rosa, CA (US); Gregory W. Eng, Fremont, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 64 days.

(21) Appl. No.: 12/508,238

(22) Filed: Jul. 23, 2009

(65) Prior Publication Data

US 2011/0018017 A1    Jan. 27, 2011

(51) Int. Cl.
*H01L 33/00* (2010.01)
(52) U.S. Cl. ............ 257/98; 257/99; 257/100; 438/25; 438/26; 438/27; 438/28; 438/29; 438/110; 438/116
(58) Field of Classification Search ............. 438/25–29, 438/110, 116; 257/98–100
See application file for complete search history.

(56) References Cited

U.S. PATENT DOCUMENTS

| | | | | |
|---|---|---|---|---|
| 7,514,867 | B2 * | 4/2009 | Yano et al. ................. | 313/512 |
| 2005/0093005 | A1 * | 5/2005 | Ruhnau et al. .............. | 257/79 |
| 2006/0055309 | A1 | 3/2006 | Ono et al. | |
| 2006/0105485 | A1 | 5/2006 | Basin et al. | |
| 2007/0228392 | A1 | 10/2007 | Plank et al. | |
| 2008/0121911 | A1 * | 5/2008 | Andrews et al. ............. | 257/98 |
| 2009/0046479 | A1 | 2/2009 | Bierhuizen et al. | |
| 2009/0057699 | A1 | 3/2009 | Basin et al. | |
| 2009/0154137 | A1 | 6/2009 | Bierhuizen et al. | |
| 2010/0051982 | A1 * | 3/2010 | Lin et al. ................. | 257/98 |
| 2010/0279437 | A1 * | 11/2010 | Neff et al. ................. | 438/14 |
| 2010/0320479 | A1 * | 12/2010 | Minato et al. ............. | 257/88 |

FOREIGN PATENT DOCUMENTS

| | | |
|---|---|---|
| JP | 11284234 A | 10/1999 |
| JP | 2002026382 A | 1/2002 |
| WO | 2010035206 A1 | 4/2010 |

OTHER PUBLICATIONS

Minato (English Translation of WO 2009/069671), Light Emitting Device and Its Manufacturing Method, Jun. 4, 2009.*

* cited by examiner

*Primary Examiner* — Kevin M Picardat
*Assistant Examiner* — Bac Au

(57) ABSTRACT

A submount wafer, having mounted on it an array of LEDs with a phosphor layer, is positioned with respect to a mold having an array of indentions. A mixture of silicone and 10%-50%, by weight, $TiO_2$, is dispensed between the wafer and the indentions, creating a molded substantially reflective material. The molded mixture forms a reflective wall covering the sidewalls of the LED. The reflective material is then cured, and the submount wafer is separated from the mold such that the reflective material covering the sidewalls contains light emitted from the LED. The submount wafer is then diced. A piece (e.g., a reflector, support bracket, etc.) may then be affixed to the submount so the LED protrudes through a center hole in the piece. The inner edge of the piece is easily formed so that it is located at any height above or below the top surface of the LED.

13 Claims, 3 Drawing Sheets

LED WITH MOLDED REFLECTIVE SIDEWALL COATING

FIELD OF INVENTION

This invention relates to light emitting diodes (LEDs) and, in particular, to a technique to inwardly reflect side-emitted light.

BACKGROUND

A semiconductor LED can be made very thin, such as under 50 microns, to maximize its light output. The semiconductor LED may also have a relatively thick phosphor layer over its top surface to wavelength-convert the light from the LED, such as for creating white light using a blue LED. Such a structure may still only have a total thickness of about 0.2-0.5 mm and a top area of less than 1 $mm^2$. The LED may be a flip chip that is bonded to metal pads on the top surface of a much larger submount so that only the robust electrodes on the bottom of the submount need to be soldered to a printed circuit board.

It is known to surround the LED (but not the submount) with a molded parabolic reflector by inserting the LED through a rectangular opening at the bottom of the reflector. Since the reflector should ideally reflect all light that is emitted from the top and sides of the LED, the inner edge of the reflector closest to the LED needs to have an extremely small thickness (called a knife edge) to capture most of the side light. Further, the ideal reflector should substantially abut the edge of the LED to capture the most side light. Such an ideal reflector is impractical to produce, and typical molded reflectors have varying spaces between the reflector edge and the LED, and the reflector inner edge (about 0.5 mm minimum thickness) blocks most of the side light from entering the reflector area.

What is needed is a technique that enables a practical molded reflector to substantially reflect all light that is emitted from an LED.

SUMMARY

A method of manufacturing an LED light source is disclosed which molds a reflective material over the sidewalls of the LED. Substantially no reflective material is over the top light emitting surface of the LED. The LED will typically include a phosphor layer, where the sidewalls of the phosphor layer and semiconductor LED are coated with the reflective material. The reflective material contains the light so substantially all light is emitted within a well-defined emission area. The top of the reflective material may be formed even with the top of the LED or extend above or below the top of the LED.

Since substantially no light is emitted from the sides of the LED, any reflector around the LED only needs to have its inner edges be even with or below the top edge of the reflective material to capture all of the LED light. In contrast to the prior art, the inner edges of the reflector do not have to be knife edges to capture the light.

In one embodiment, a bowl-shaped reflector surrounds the LED and reflective material.

In another embodiment, the LED with reflective sides is mounted within an opening in a reflective piece, such as a white plastic piece. The opening in the reflective piece is wider than the outer walls of the sidewall reflective material, and the reflective piece is higher than the top of the sidewall reflective material. Some low-angled light rays will reflect off the inner walls of the reflective piece extending above the sidewall reflective material. This creates an apparent light source size that is larger than the size of the LED and also creates a brightness profile that tapers toward the edge of the reflective piece. This is advantageous in certain applications, such as where light from multiple light sources must blend together.

The reflective material over the LED sidewalls may also be made less reflective so that side light penetrates deeper into the reflective material. This smoothes the apparent edges of the light source, which is advantageous in certain applications, such as where light from multiple light sources must blend together.

In another embodiment, the reflective material over the LED sidewalls enables light absorptive materials to be employed next to the LED without the light absorptive materials reducing the overall light output. For example, a black plastic bracket may be used to hold the LED submount onto a heat sink or other substrate without the bracket absorbing side light.

Other embodiments are also described.

In one embodiment, an array of LEDs, each with a phosphor layer such as a phosphor plate, are mounted on a submount wafer. The wafer is positioned with respect to a mold having an array of indentions. The indentions are filled with a mixture of silicone and 10%-50%, by weight, $TiO_2$, creating a substantially reflective material. The $TiO_2$ appears white under white ambient light. With low percentages of $TiO_2$ (e.g., 10-15%), the light boundary becomes softer since light penetrates more deeply into the reflective material. The indentions have dimensions larger than outer dimensions of the LEDs such that the reflective material will form a reflective wall around the sidewalls of the LED.

The top surfaces of the LEDs substantially contact the bottom surface of the indentions such that no significant thickness of reflective material exists between the top surface and the indention. Any reflective material over the top surface of the LED may be removed using a variety of techniques, such as microbead blasting and laser ablation. In some applications, a very thin coating of $TiO_2$ is desired over the phosphor layer since it creates a more aesthetically pleasing white appearance without significantly reflecting back light.

The reflective material is then cured, and the submount wafer is separated from the mold such that the reflective material covering the sidewalls contains light emitted from the LEDs. The submount wafer is then diced. Various other methods are described for forming the reflective material around the sidewalls of the LED.

A bowl-shaped reflector or other element is then affixed to the submount. The reflector (or other element) has an opening in which the LED is inserted. Since the reflective material over the LED sidewalls is at least as high as the LED, the inner edges of the reflector (or other element) just need to be even with or below the top of the reflective material to capture substantially all of the LED light. In some embodiments, the outer element has inner reflecting walls higher than the sidewall reflective material.

A lens may be affixed to the submount around the LED instead of a reflector.

BRIEF DESCRIPTION OF THE DRAWINGS

Elements that are similar or identical in the various figures are labeled with the same numeral.

DETAILED DESCRIPTION

Figure 1:
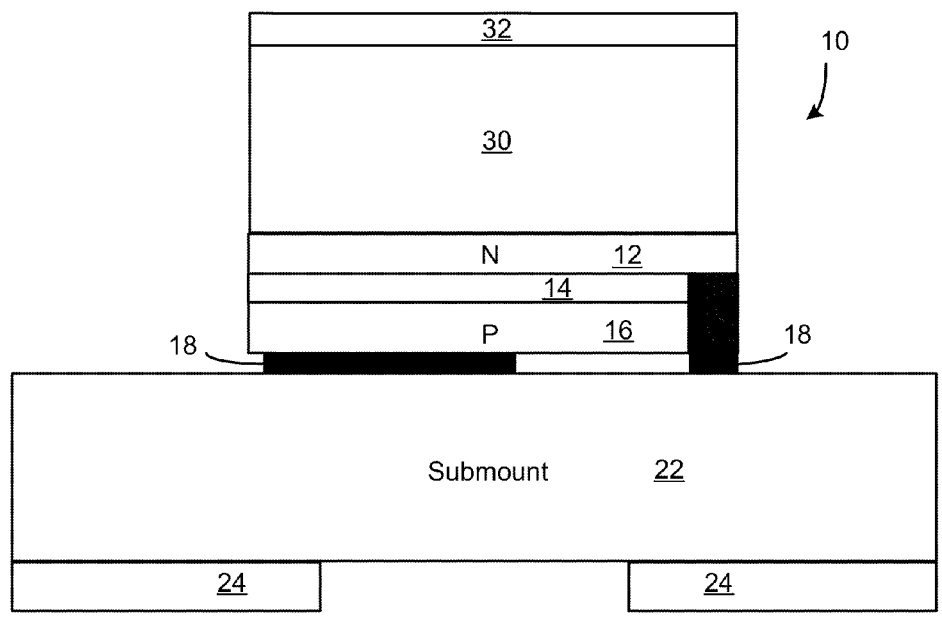
FIG. 1 is a cross-sectional view of a blue LED mounted on a submount wafer, with a phosphor plate (e.g., yellow-green YAG) affixed to the top surface.

Although the invention can be applied to any type of LED, one particular LED will be described that is used in all examples. FIG. 1 is a cross-sectional view of a white light LED 10.

The active layer of the LED 10 in the example generates blue light. The LED 10 is formed on a starting growth substrate, such as sapphire, SiC, or GaN. Generally, an n-layer 12 is grown followed by an active layer 14, followed by a p-layer 16. The p-layer 16 is etched to expose a portion of the underlying n-layer 12. Reflective metal electrodes 18 (e.g., silver, aluminum, or an alloy) are then formed over the surface of the LED to contact the n and p layers. There may be many distributed electrodes to more evenly spread the current. When the diode is forward biased, the active layer 14 emits light whose wavelength is determined by the composition of the active layer (e.g., AlInGaN). Forming such LEDs is well known and need not be described in further detail. Additional detail of forming LEDs is described in U.S. Pat. No. 6,828, 596 to Steigerwald et al. and U.S. Pat. No. 6,876,008 to Bhat et al., both assigned to the present assignee and incorporated herein by reference.

The semiconductor LED is then mounted on a submount 22 as a flip chip. The submount 22 is part of a submount wafer on which many LEDs are mounted, and the submount is later singulated. The top surface of submount 22 contains metal electrodes that are soldered or ultrasonically welded to the metal electrodes 18 on the LED via solder balls. Other types of bonding can also be used. The solder balls may be deleted if the electrodes themselves can be ultrasonically welded together.

The submount electrodes are electrically connected by vias to cathode and anode pads 24 on the bottom of the submount so the submount can be surface mounted to metal pads on a printed circuit board, which may form part of a flash module for a camera. Metal traces on the circuit board electrically couple the pads to a power supply. The submount 22 may be formed of any suitable material, such as ceramic, silicon, aluminum, etc. If the submount material is conductive, an insulating layer is formed over the substrate material, and the metal electrode pattern is formed over the insulating layer. The submount 22 acts as a mechanical support, provides an electrical interface between the delicate n and p electrodes on the LED chip and a power supply, and provides heat sinking. Submounts are well known.

To cause the LED 10 to have a low profile and to prevent light from being absorbed by the growth substrate, the growth substrate is removed, such as by CMP or using a laser lift-off method, where a laser heats the interface of the GaN and growth substrate to create a high-pressure gas that pushes the substrate away from the GaN. In one embodiment, removal of the growth substrate is performed after an array of LEDs is mounted on a submount wafer and prior to the LEDs/submounts being singulated (e.g., by sawing). The final thickness of the semiconductor layers may be about 40 microns. The LED layers plus submount may be about 0.5 mm thick.

Processing of the LED semiconductor layers may occur before or after the LED is mounted on the submount wafer.

In one embodiment, after the growth substrate is removed, a phosphor layer 30, formed as a preformed plate, is affixed over the top of the LED, such as by silicone, for wavelength-converting the blue light emitted from the active layer 14. In another embodiment, the phosphor layer 30 may be spray deposited, spun-on, thin-film deposited by electrophoresis, or formed using any other technique, either prior to the LEDs being singulated from the growth wafer or after the LEDs are mounted on the submount wafer. The phosphor layer 30 may be phosphor particles in a transparent or translucent binder, which may be organic or inorganic, or may be sintered phosphor particles.

The light emitted by the phosphor layer 30, when mixed with blue light, creates white light or another desired color. In the example, the phosphor is a yttrium aluminum oxide garnet (YAG) phosphor that produces yellow light (Y+B=white). The phosphor may be any other phosphor or combination of phosphors, such as a red phosphor and a green phosphor (R+G+B=white), to create white light. The thickness of the phosphor layer 30 may be about 100 microns or more, depending on the desired overall color to be emitted and the brightness of the LED.

In one embodiment, a thin layer 32 of silicone infused with about 1% of $TiO_2$ is then deposited over the phosphor layer 30 surface to make the yellowish YAG phosphor appear white for aesthetic purposes. The thickness may be on the order of 30-100 microns. The thin layer 32 also serves to help prevent cracking of the phosphor layer 30 during a subsequent molding process when the top of the LED may come in contact with a rigid mold under pressure. Instead of silicone, sol-gel may be used. The layer 32 is optional. Other top layers may be formed, including a dichroic filter layer. If a remote phosphor layer is used, a dichroic filter layer over the LED is useful for allowing the LED light to pass and reflecting the back-scattered phosphor light.

Figure 2:
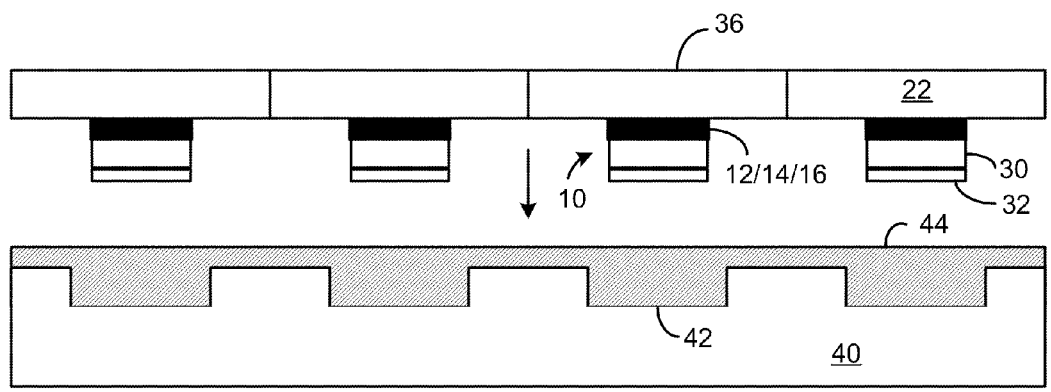
FIG. 2 is a cross-sectional view of a plurality of the LEDs of FIG. 1 mounted on a submount wafer, and a cross-sectional view of a mold filled with liquid silicone infused with about 10%-50% (by weight) $TiO_2$.

FIG. 2 illustrates the submount wafer 36 and LEDs 10 of FIG. 1. Lines are drawn on the wafer 36 illustrating where the wafer 36 will be later sawed or broken for singulation.

A mold 40, also known as a chase, has indentions 42 that are preferably more shallow than the LEDs 10 to ensure that the tops of the LEDs contact or come very close to the flat bottom surface of each indention 42. The indentions 42 are slightly wider than the LEDs 10, where the difference will be the thickness of the molded material covering the sides of the LEDs 10. The indentions 42 can have very precise dimensions, and the outer dimensions of the molded material will be independent of any variances in the outer dimensions of the LEDs 10 and their placement on the submount wafer 36.

A viscous mixture 44 of silicone and $TiO_2$ is precisely dispensed over the mold 40 to fill the indentions 42 and also create a thin layer between the indentions 42. If the mixture 44 had a very low viscosity, a raised seal would be used around the mold 40.

The percentage, by weight, of the $TiO_2$ in the silicone is sufficient to cause the cured mixture to be substantially reflective (e.g., over 75%) but not significantly diminish the properties of the silicone. Generally, about 10%-50% $TiO_2$ is used, where the reflectivity is related to the percentage of $TiO_2$. Other whitish inert particles, such as $ZrO_2$ and $Al_2O_3$, may be used instead of $TiO_2$. In one embodiment, the average $TiO_2$ particle size is 0.25 micron.

Figure 3:
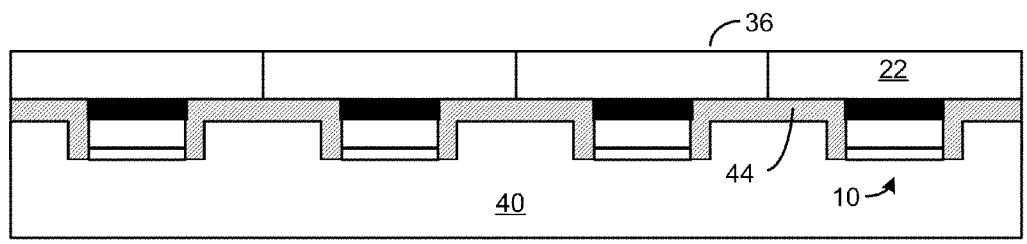
FIG. 3 illustrates the wafer and the mold of FIG. 2 being brought together to compression mold the silicone/$TiO_2$ around only the sides of each LED.

The submount wafer 36 and mold 40 are brought together under pressure so that the LEDs 10 are immersed in the mixture 44, as shown in FIG. 3. The viscosity of the mixture 44 tends to increasingly resist the pressure as the wafer 36 surface nears the mold 40 surface. When the tops of the LEDs 10 are just touching the bottoms of the indentions 42, pressure is maintained and the silicone is cured, such as by heating. By measuring the pressure, it can be known when the tops of the LEDs are contacting the bottom of the indentions 42.

Figure 4:
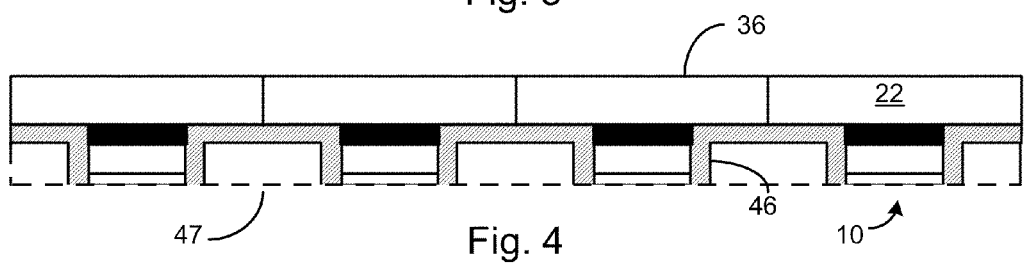
FIG. 4 illustrates the wafer after the silicone is cured and the wafer is removed from the mold.

The wafer 36 and mold 40 are then separated, as shown in FIG. 4, and the hardened silicone/$TiO_2$ 46 may be further cured by heating or UV. The submount wafer 36 is then singulated along the lines by sawing or breaking.

The relatively thick layer of silicone/$TiO_2$ 46 covering the sides of the LED 10 reflects substantially all of the LED side light (e.g., at least 75%). After any reflection off the silicone/$TiO_2$ 46, the light will ultimately exit through the top surface of the LED 10. In one embodiment, the thickness of the silicone/$TiO_2$ 46 covering the sidewalls of the LED 10 is 0.1 mm-1 mm. The thickness should be that needed to adequately reflect the light. The size of the mold indentions 42 needs to take into account any variances in the LED 10 size and misalignments of the LED 10 placement on the submount wafer 36 as well as the depth of penetration of light into the silicone/$TiO_2$ 46. A penetration on the order of 50 microns is typical for a medium reflective silicone/$TiO_2$ 46.

In the event that a very thin layer of the silicone/$TiO_2$ 46 is formed over the top surface of the LED 10 due to variances in the heights of the LEDs 10 above the submount wafer 36, such a small thickness will not cause any significant reflection (e.g., less than 1%). Any undesirable silicone/$TiO_2$ 46 over the top surface may be removed by microbead blasting, laser ablation, polishing, or other technique.

In another embodiment, the silicone/$TiO_2$ mixture 44 fills a single large indention in the mold and, when the wafer 36 and mold are brought together, the mixture 44 just fills the gaps between LEDs 10, so there are no steps in the silicone/$TiO_2$ 46. FIG. 4 shows the outline 47 of such a planar silicone/$TiO_2$ layer. In another embodiment, the mixture 44 is initially deposited on the LEDs 10, and the mold indention(s) shape(s) the mixture 44 when the wafer 36 and mold are brought together. In one embodiment, the mold causes the silicone/$TiO_2$ 46 to create walls around the LEDs 10 that are higher than the LEDs 10. In another embodiment, the mixture 44 is dispensed around the LEDs 10 individually and then cured without using a mold, but using a mold to create precise dimensions is preferred and much faster than dispensing the mixture 44 around each LED 10.

Figure 5:
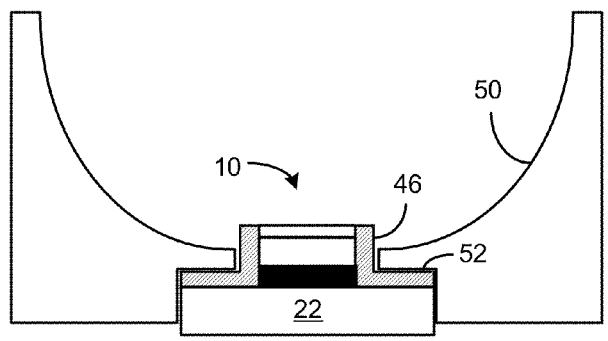
FIG. 5 is a cross-sectional view of a singulated LED being affixed to a reflector, where the inner edge of the reflector need not be a knife edge for the reflector to receive virtually all light emitted by the LED (the relative size of the reflector would normally be larger since the LED may only be 0.5 mm high).

FIG. 5 illustrates the LED 10 and submount 22 being epoxied to a parabolic reflector 50. The reflector 50 is molded plastic with a thin specular metal sputtered or evaporated onto the bowl surface. Aluminum, silver, chromium or other suitable metals may be used as the specular metal. The epoxy is dispensed on the shelf 52 on the underside of the reflector 50, and the LED/submount is positioned using an automatic pick and place machine.

Note that the inner edges of the reflector 50 can have a relatively large thickness (e.g., up to 0.5 mm) yet not reduce the light capture, since the edge of the reflector 50 is below or about even with the top surface of the LED 10 and substantially no light escapes from the sides. The amount of light passing through the silicone/$TiO_2$ 46 depends on the $TiO_2$ percentage and the thickness of the silicone/$TiO_2$ 46. In other embodiments, described later, the height of the reflector may be above the height of the LED.

Since the outer dimensions of the silicone/$TiO_2$ 46 are precisely determined by the mold indentions 42, the reflector 50 opening does not have to take into account variances in the LED 10 size or misalignments of the LED 10 on the submount wafer 36. Further, the vertical positioning of the reflector 50 is constant since the thickness of the silicone/$TiO_2$ 46 over the submount 22 surface can be precisely controlled by the molding process. The molded step of the silicone/$TiO_2$ 46 can be used for alignment of any optical element.

The sidewall reflective material does not need to cover the sides of the LED to the full height of the LED since, in some applications, the reflective material just needs to cover the sidewall to a height where there is no loss of light. For, example, in FIG. 5, the silicone/$TiO_2$ 46 just needs to be at a height even with the inner edge of the reflector 50, and that may be the preferred height for a uniform light projection from the reflector 50. For thick phosphor layers, it may be easy to form the inner edge of an external reflector thinner than the height of the phosphor layer. However, the thickness of the silicone/$TiO_2$ 46 will almost always be greater than the top of the semiconductor portion (top of n-layer 12) of the LED and have a step height above the submount 22 surface of at least 10% of the thickness of the phosphor layer. Therefore, the mold 40 will have suitable shaped indentions to achieve such desired heights.

Figure 6:
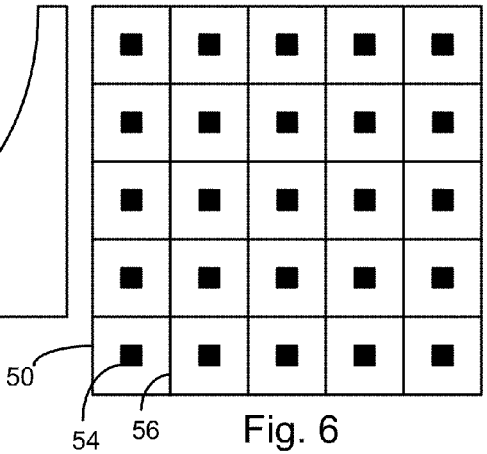
FIG. 6 is a top down view of a molded array of reflectors, so the placement of the LEDs in the reflectors is performed on an array scale to simplify handling.

FIG. 6 is a front view of a molded array of reflectors 50 with openings 54 for receiving an LED in the manner shown in FIG. 5. Once all LEDs are affixed to a reflector 50, the array of reflectors 50 is singulated by sawing or breaking along the reflector boundaries, such as along molded weakened lines 56. FIG. 6 may also be used to illustrate an array of any optical elements to be used with the LEDs.

The resulting structure of FIG. 5 may be used as a flash in a camera, which may be a cell phone camera, where the electrodes 24 (FIG. 1) of the submount 22 are soldered to pads on a printed circuit board supporting the flash electronics.

Figure 7:
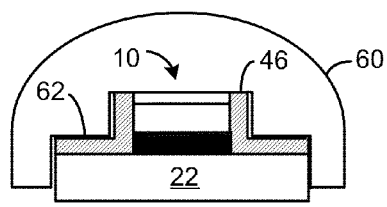
FIG. 7 is cross-sectional view of a singulated LED being affixed to a lens.

FIG. 7 illustrates the LED 10 and submount 22 being affixed to a preformed molded lens 60 by epoxy dispensed on the lens shelf 62. The lens 60 may have any shape. The lens 60 may have been connected to other lenses in a lens array, when the LEDs/submounts were affixed to the lenses 60. Due to the reflective silicone/$TiO_2$ 46, the side emission is reduced. This may be beneficial for camera flash applications where the light is to be restricted to a certain angle.

Figure 8:
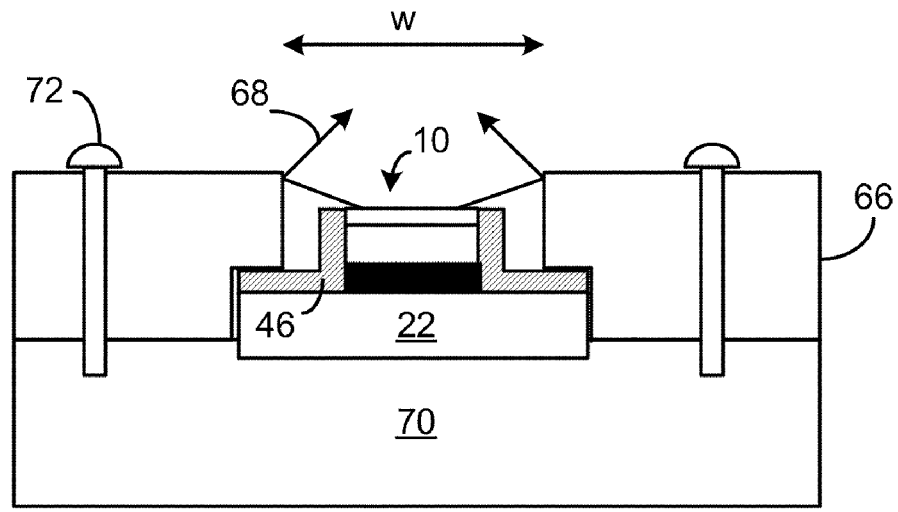
FIG. 8 illustrates a white plastic piece surrounding and taller than the LED for creating the appearance of a light source larger than the LED.

FIG. 8 illustrates an embodiment where a reflective piece 66 is affixed to the submount 22, and the reflective piece 66 extends above the top of the LED 10. The reflective piece 66 may be a white plastic or other reflective material. The low-angle light rays 68 from the top of the LED 10 reflect off the inner walls of the reflective piece 66 so that the light source appears to have a larger width w. This also creates a softer boundary of the light source, which may be beneficial when blending light from multiple light sources. Making the reflective piece 66 higher increases the brightness near the boundary since it intercepts more light from the LED 10. In FIG. 8, the reflective piece 66 also serves to tightly secure the submount 22 against a heat sink 70, using screws 72. The heat sink 70 may be a metal core circuit board.

The reflective piece 66 may contain reference holes or pins for alignment of other optical elements over the LED 10.

Figure 9:
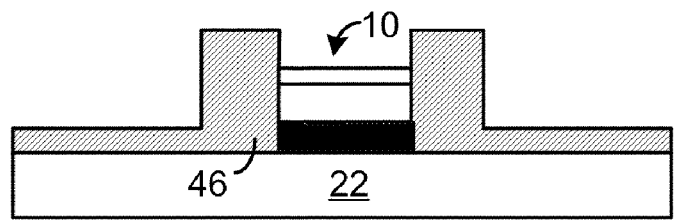
FIG. 9 illustrates a thick-walled reflective material over the sides of the LED, where the reflective material has a low percentage of $TiO_2$, to create a light source with smooth boundaries.

FIG. 9 illustrates that the silicone/$TiO_2$ 46 may be formed to extend above the LED 10. The silicone/$TiO_2$ 46 will create a diffused boundary if the $TiO_2$ percentage is low enough. This may be used to increase the apparent size of the light source since more light is reflected by the silicone/$TiO_2$ 46 due to its increased height, and the light penetrates into the silicone/$TiO_2$ 46.

The invention of a reflective molded material on the sides of an LED may be useful in certain applications even without connecting the LED to a reflector or lens. For example, in applications where side emissions are not desired, the silicone/$TiO_2$ 46 can be used to contain the light emission within a defined boundary. Further, by adjusting the $TiO_2$ percentage and thickness of the silicone/$TiO_2$ 46, the shape and boundary profile of the light source is controllable. For example, by lowering the $TiO_2$ percentage, the light source has a softer edge, and the silicone/$TiO_2$ 46 can be made thicker to ensure light is reflected within the silicone/$TiO_2$ 46.

Figure 10:
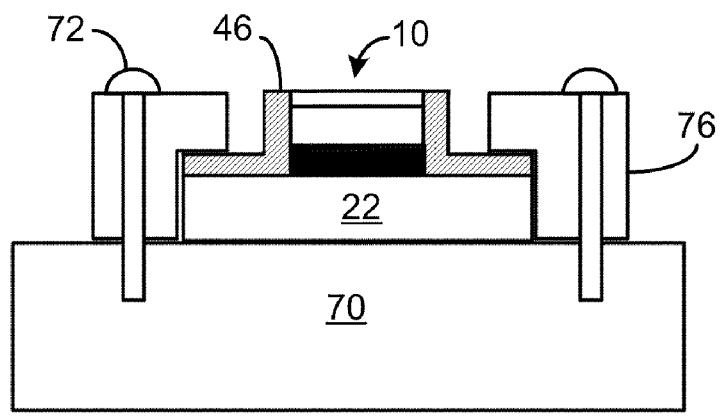
FIG. 10 illustrates a light absorbing element used to secure the submount to a heat sink, where the reflective material over the LED sidewalls avoids the element absorbing LED light.

FIG. 10 illustrates the use of the silicone/$TiO_2$ 46 to prevent light from the LED 10 being absorbed by a light absorbing retainer 76 or other structure. The retainer 76 may be black plastic or other light absorbing material. Also, if the retainer 76 reflects somewhat, the silicone/$TiO_2$ 46 prevents the retainer 46 from creating an undesired light emission surrounding the LED 10. This greatly frees up the possibilities for different materials being used proximate the LED 10. The retainer 76 may extend slightly above the LED 10 with little adverse effect.

A phosphor layer is not required for the invention. A relatively thick clear layer may be formed over the semiconductor LED, or a portion of the growth substrate may be left, to provide sidewalls for adhesion of the molded silicone/$TiO_2$ 46.

Having described the invention in detail, those skilled in the art will appreciate that given the present disclosure, modifications may be made to the invention without departing from the spirit and inventive concepts described herein. Therefore, it is not intended that the scope of the invention be limited to the specific embodiments illustrated and described.

What is claimed is:

1. A light emitting device comprising:
   a light emitting diode (LED) having sidewalls and a top surface;
   a submount on which the LED is mounted, the submount having side edges and a bottom surface, the bottom surface having metal pads for bonding to a circuit board;
   a substantially reflective material provided directly over the sidewalls, the reflective material comprising a substantially transparent material containing inert non-phosphor particles causing reflection, the particles being at least 10% by weight of the reflective material, the particles having a substantially white color under white ambient light,
   the reflective material not substantially covering the top surface of the LED, such that the reflective material covering the sidewalls at least partially contains light emitted from the LED; and
   a reflector, formed separately from the LED, submount, and reflective material, the reflector having an opening in which the LED is inserted, the reflector having inner edges forming a perimeter around the LED that are positioned above a top surface of the submount but below the top surface of the LED,
   wherein the reflector has outer edges that extend beyond the side edges of the submount and has an indent in which the submount is seated, wherein a bottom surface of the reflector does not extend below the bottom surface of the submount, and wherein the reflector has reflective walls that extend above the reflective material.

2. The device of claim 1 wherein the particles comprise one of $TiO_x$, $ZrO_x$, or $Al_2O_3$.

3. The device of claim 1 wherein the particles comprise about 20%-50%, by weight, of the reflective material.

4. The device of claim 1 wherein an average diameter of the particles is less than one micron.

5. The device of claim 1 wherein the substantially transparent material comprises silicone.

6. The device claim 1 wherein the LED comprises a phosphor layer, the reflective material covering sidewalls of the phosphor layer.

7. The device of claim 6 wherein the phosphor layer is a plate affixed to a top surface of a semiconductor portion of the LED.

8. The device of claim 1 wherein the inner edges of the reflector are spaced from outer edges of the reflective material.

9. The device of claim 1 wherein the reflective material extends at least as high as the top surface of the LED.

10. A method of manufacturing a light emitting device comprising:
    providing a light emitting diode (LED) mounted on a submount, the LED having sidewalls and a top surface;
    positioning the submount with respect to a mold having an indention;
    providing a substantially reflective material between the submount and the mold, the reflective material comprising a substantially transparent material containing inert non-phosphor particles causing reflection, the particles being at least 10% by weight of the reflective material, the particles having a substantially white color under white ambient light, the indention having dimensions larger than an outer dimension of the LED such that the reflective material forms a reflective wall covering the sidewalls of the LED, and such that no significant thickness of reflective material exists between the top surface and the indention;
    curing the reflective material;
    separating the submount from the mold such that the reflective material covering the sidewalls contains light emitted from the LED, the submount having side edges and a bottom surface, the bottom surface having metal pads for bonding to a circuit board; and
    affixing a reflective piece to the submount, the reflective piece having an opening in which the LED is inserted, inner edges of the reflective piece surrounding the reflective material, wherein the reflector has outer edges that extend beyond the side edges of the submount and has an indent in which the submount is seated, wherein a bottom surface of the reflector does not extend below the bottom surface of the submount, and wherein the reflector has reflective walls that extend above the reflective material.

11. The method of claim 10 wherein the particles comprise comprise one of $TiO_x$, $ZrO_x$, or $Al_2O_3$.

12. The method of claim 10 wherein the LED comprises a phosphor layer, the reflective material covering sidewalls of the phosphor layer.

13. The method of claim 10 wherein positioning the submount with respect to the mold comprises positioning a submount wafer, having mounted thereon a plurality of LEDs, with respect to the mold having a plurality of identical indentions corresponding to each LED position on the submount wafer.

* * * * *